CARRIER-SUPPRESSED MODULATOR
Filed Nov. 18, 1960
FIG. 1
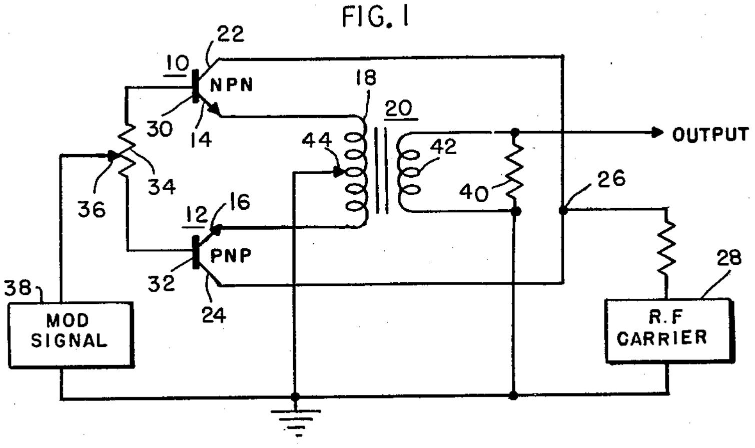
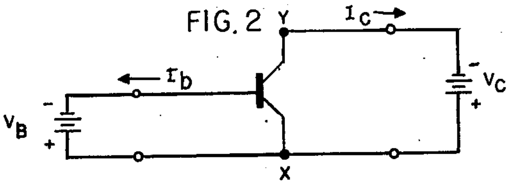
FIG. 2
FIG. 3
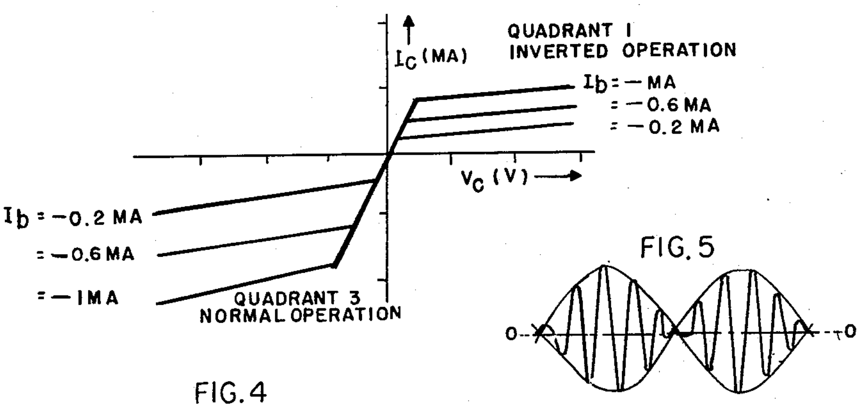
FIG. 3, FIG. 5
FIG. 4
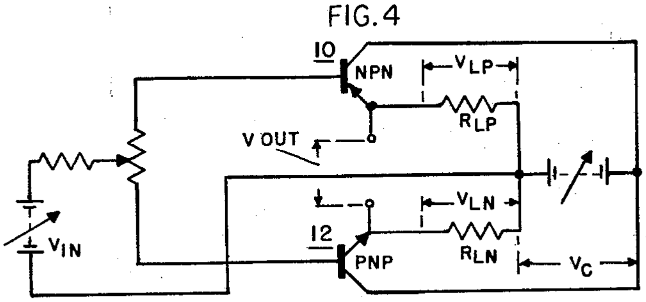
*INVENTOR,*
DALE P. MASHER
BY Jack H. Linscott
ATTORNEY.

United States Patent Office 3,101,455
Patented Aug. 20, 1963

3,101,455
CARRIER-SUPPRESSED MODULATOR

Dale P. Masher, Los Altos, Calif., assignor to the United States of America as represented by the Secretary of the Army Filed Nov. 18, 1960, Ser. No. 70,360
5 Claims. (Cl. 332—43)
(Granted under Title 35, U.S. Code (1952), sec. 266)

The invention described herein may be manufactured and used by or for the Government for governmental purposes, without the payment of any royalty thereon.

This invention relates to non-linear translating circuits and more particularly to modulating circuits incorporating semi-conductor devices of opposite conductivity or complementary symmetry.

Suppressed carrier modulation systems utilizing vacuum tubes are well known. Such modulation systems are usually provided with a pair of electron discharge devices in a symmetrical or balanced circuit arrangement. While transistors may be adapted to symmetrical modulation circuits, such circuits have heretofore usually required fixed D.-C. biases for proper operation. Transistors, as distinguished from vacuum tubes, may be of opposite conductivity types or complementary symmetry types as disclosed, for example, in an article by George C. Sziklai in the June 1953 Proceedings of the IRE (pages 717–724). This characteristic of transistors is utilized in accordance with the present invention in a signal modulation circuit.

It is an object of the present invention to provide a modular circuit utilizing a pair of semi-conductor devices of the opposite conductivity type.

It is another object of the present invention to provide an improved modulator circuit utilizing a pair of semi-conductor devices of the opposite conductivity type and wherein no potential bias supplies are necessary.

It is still another object of the present invention to provide an improved modulator circuit utilizing a pair of semi-conductor devices of the opposite conductivity type and wherein high linearity of the output envelope is achieved.

It is still another object of the present invention to provide a modulating circuit wherein the modulating signal and the carrier signal are simultaneously suppressed.

In accordance with the present invention there is provided a modulating circuit which includes a pair of semi-conductor devices of opposite conductivity type each having emitter, collector and base electrodes with the collector electrodes being connected in common. Also included is an inductor serially connected between the emitter electrodes and an input circuit connected between the center-tap and the common collector electrode connection to provide a first input signal in phase between the collector electrodes. Included further is a second input circuit connected between the center-tap and the base electrodes for providing a second input signal of the same phase therebetween and means including a load resistor coupled to the center-tapped inductor for deriving an output signal.

For a better understanding of the invention together with further objects thereof, reference is had to the following description taken in connection with the accompanying drawings in which:

FIG. 1 is a schematic circuit diagram of the modulator in accordance with the present invention;

FIGS. 2 and 3 are representative diagrams to illustrate normal and inverted mode transistor operation;

FIG. 4 illustrates an equivalent circuit diagram of FIG. 1 to illustrate the operation of the modulator; and FIG. 5 shows the output waveform of the modulator.

Referring now to FIG. 1 of the drawing, there is shown at 10 and 12 a pair of junction transistors of opposite conductivity type, herein shown as NPN and PNP types, respectively. Each transistor includes a base electrode, an emitter electrode, and a collector electrode. The respective emitter electrodes 14 and 16 are connected by the primary winding 18 of output tranformer 20 and the respective collector electrodes 22 and 24 are connected in common at 26. As shown, the carrier-wave signal from a source 28 is fed single-ended to both collector electrodes 22 and 24 through the common connection 26. The respective base electrodes 30 and 32 are connected across the end terminals of a potentiometer 34, the sliding contact member 36 thereof being connected to the output of modulating signal input source 38. An output variable load resistor 40 is connected across the secondary winding 42 of transformer 20. The signal modulating input signal, the carrier signal, and the output signal derived across resistor 40 are referenced with respect to an adjustable center-tap 44 provided in primary winding 18 and which, for convenience, is shown to be grounded. With the arrangement described above, both the carrier and input signal are fed in single-ended while the desired output signal is derived from resistor 40 by means of push-pull transformer 20.

Complementary transistors 10 and 12 operate in both the normal and inverted mode of operation. The term "normal mode" of operation refers to the standard transistor operation wherein, for a PNP type, the circuit functions as a common emitter configuration. Such a representative circuit is shown in FIG. 2 wherein the X terminal is the emitter and the Y terminal is the collector. For this type of configuration, the collector current is negative for negative base and collector voltages as shown in quadrant 3 of the static characteristic curve for a PNP transistor (FIG. 3). If the normal collector bias is now reversed, the Y terminal becomes the emitter, the X terminal becomes the collector and the collector current flows in the opposite direction as shown in quadrant 1 of FIG. 3. The PNP transistor circuit may now be said to operate in the inverted mode and thereby becomes a common collector configuration due to the fact that the collector-base diode is now forward biased (low resistance) and the emitter-base diode is now reverse biased (high resistance direction). For the NPN transistor, of course, the normal mode or standard operation comprises a common collector configuration and in inverted operation, the NPN transistor comprises a common emitter configuration. The slider 36 of potentiometer 34 proportions the values of the respective resistances which are present between each transistor base electrode and ground. Thus the potentiometer 34 allows the balance of the complementary transistors with unequal betas (B) inverted, since in inverted operation, each transistor works as a common emitter configuration.

With the above explanation in mind and with reference to the equivalent circuit shown in FIG. 4, the operation of the balanced modulator will now be described. In FIG. 4, $R_{LN}$ designates the load resistor when the PNP transistor operates in the normal mode and $R_{LP}$ designates the load resistor when the NPN transistor operates in the normal mode. The voltages developed across these resistors are correspondingly labeled $V_{LN}$ and $V_{LP}$. Assuming now one complete cycle of the instantaneous carrier, during the positive-half period NPN transistor 10 conducts in the normal mode and PNP transistor 12 conducts in the inverted mode. During the negative half-cycle the two transistors interchange their mode of operation. The input modulating voltage, when moving in the positive direction will increase the current through NPN transistor 10 and simultaneously decrease the current through PNP transistor 12. Thus the currents through load resistors $R_{LP}$ and $R_{LN}$ are respectively increased and decreased. The difference of the two voltages developed across $R_{LN}$ and $R_{LP}$ provides the output signal, in magnitude and polarity, derived across load resistor 40 through transformer 20. If the difference amplitudes generated in this manner are equal, which is approximately the case, the output of the modulator will be that shown in FIG. 5 which typically indicates that two desired side bands are generated and the carrier as well as the input signal is suppressed in the output. It can be shown that the difference in the voltages $V_{LN}$ and $V_{LP}$ is approximately zero throughout the entire carrier swing indicating that the carrier is suppressed in the output signal.

While there has been described what is at present considered to be the preferred embodiment of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A modulating circuit comprising a pair of semi-conductor devices of opposite conductivity type each having emitter, collector and base electrodes, said collector electrodes being directly connected in common, an inductor serially connected between said emitter electrodes and including a center-tap, an input circuit connected between said center-tap and said common collector electrode connection to provide a first input signal in phase between said collector electrodes, a second input circuit connected between said center-tap and said base electrodes for providing a second input signal of the same phase therebetween, and means including a load resistor coupled to said inductor for deriving an output signal.

2. A modulating circuit comprising a pair of semi-conductor devices of opposite conductivity type each having emitter, collector and base electrodes, said collector electrodes being directly connected in common, an inductor serially connected between said emitter electrodes and including a center-tap, a potentiometer including a slider contact arm connected between said base electrodes, an input circuit connected between said center-tap and said common collector electrode connection to provide a first input signal in phase between said collector electrodes, a second input circuit connected between said center-tap and said slider arm for providing a second input signal of the same phase therebetween, and means including a load resistor coupled to said inductor for deriving an output signal, said output signal being referenced with respect to said center-tap.

3. A modulating circuit comprising a pair of semi-conductor devices of opposite conductivity type each having emitter, collector and base electrodes, said collector electrodes being directly connected in common, a source of carrier voltage signal having its output applied to the common connection to provide a signal in phase between said collector electrodes, a source of modulating voltage signal having its output applied to said base electrodes to provide a signal in phase therebetween, and means in circuit with both said emitter electrodes for deriving an output signal.

4. The modulating circuit in accordance with claim 3 wherein said last mentioned means comprises a transformer having its primary winding serially connected between said emitter electrodes and including a center-tap, the output signal being derived across the secondary winding of said transformer.

5. A modulating circuit comprising a pair of semi-conductor devices of opposite polarity type each having emitter, collector and base electrodes, said collector electrodes being directly connected in common, a potentiometer including a sliding contact being connected between said base electrodes, a source of carrier voltage signal having its output applied to the common connection to provide a signal in phase between said collector electrodes, a source of modulating voltage signal having its output applied to said base electrodes through said sliding contact to provide a signal in phase between said base electrodes, a transformer having a primary winding including a center-tap and a secondary winding, said primary winding being serially connected between said emitter electrodes, a load resistor connected across said secondary winding for deriving an output signal, said carrier signal, said modulating signal and said output signal being referenced with respect to said center-tap.

References Cited in the file of this patent

UNITED STATES PATENTS

| | | |
|---|---|---|
| 2,820,199 | Greefkes | Jan. 14, 1958 |
| 2,827,611 | Beck | Mar. 18, 1958 |
| 2,890,418 | Zawels | June 9, 1959 |
| 2,907,932 | Patchell | Oct. 6, 1959 |
| 2,943,271 | Willis | June 28, 1960 |